United States Patent
Xu et al.

(10) Patent No.: US 9,252,240 B2
(45) Date of Patent: Feb. 2, 2016

(54) MANUFACTURING METHOD FOR SEMICONDUCTOR DEVICE WITH DISCRETE FIELD OXIDE STRUCTURE

(71) Applicant: CSMC TECHNOLOGIES FAB1 CO., LTD., Wuxi New District (CN)

(72) Inventors: Jian Xu, Wuxi New District (CN); Min He, Wuxi New District (CN); Shu Zhang, Wuxi New District (CN); Zehuang Luo, Wuxi New District (CN); Xiaojia Wu, Wuxi New District (CN)

(73) Assignee: CSMC TECHNOLOGIES FAB1 CO., LTD., Wuxu New District (CN)

( * ) Notice: Subject to any disclaimer, the term of this patent is extended or adjusted under 35 U.S.C. 154(b) by 0 days.

(21) Appl. No.: 14/436,016

(22) PCT Filed: Dec. 31, 2013

(86) PCT No.: PCT/CN2013/091201
§ 371 (c)(1),
(2) Date: Apr. 15, 2015

(87) PCT Pub. No.: WO2014/114179
PCT Pub. Date: Jul. 31, 2004

(65) Prior Publication Data
US 2015/0295069 A1 Oct. 15, 2015

(30) Foreign Application Priority Data
Jan. 23, 2013 (CN) .......................... 2013 1 0025246

(51) Int. Cl.
*H01L 21/762* (2006.01)
*H01L 29/66* (2006.01)
(Continued)

(52) U.S. Cl.
CPC ...... *H01L 29/66681* (2013.01); *H01L 21/0217* (2013.01); *H01L 21/02233* (2013.01);
(Continued)

(58) Field of Classification Search
CPC . H01L 21/762; H01L 21/32; H01L 27/10861; H01L 21/336; H01L 21/823892; H01L 27/10876; H01L 29/66818
USPC .................................. 438/225, 297, 362, 439
See application file for complete search history.

(56) References Cited

U.S. PATENT DOCUMENTS 5,024,961 A * 6/1991 Lee ....................... H01L 21/266
148/DIG. 18
5,397,732 A 3/1995 Chen
(Continued)

FOREIGN PATENT DOCUMENTS

| CN | 101131543 | 2/2008 |
|---|---|---|
| CN | 101924059 | 12/2010 |
| CN | 102593040 | 7/2012 |

*Primary Examiner* — Selim Ahmed
(74) *Attorney, Agent, or Firm* — Hamre, Schumann, Mueller & Larson, P.C.

(57) ABSTRACT

A manufacturing method for a semiconductor device with a discrete field oxide structure is provided, the method includes: growing a first PAD oxide layer on the surface of a wafer; forming a first silicon nitride layer (302) on the first PAD oxide layer through deposition; defining a field region by photolithography and etching same to remove the first silicon nitride layer (302) located on the field region; performing an ion implantation process to the field region; performing field region oxidation to grow a field oxide layer (304); peeling off the first silicon nitride layer (302); wet-dipping the wafer to remove the first PAD oxide layer and a part of field oxide layer (304); growing a second PAD oxide layer on the surface of the wafer, and forming a second silicon nitride layer (312) on the second PAD oxide layer through deposition; defining a drift region by photolithography and etching same to remove the second silicon nitride layer (312) on the drift region; performing an ion implantation process to the drift region; and performing drift region oxidation to grow a drift region oxide layer (314). The above-mentioned method peels off the silicon nitride layer (302) after the growth of the field oxide layer (304) is finished, at this time, the length of a bird beak of field-oxide (304) can be optimized by adjusting a wet-dipping amount to solve the problem that the bird beak of field-oxide (304) is too long.

11 Claims, 4 Drawing Sheets

(51) Int. Cl.
- *H01L 29/10* (2006.01)
- *H01L 21/02* (2006.01)
- *H01L 21/265* (2006.01)
- *H01L 21/306* (2006.01)
- *H01L 21/311* (2006.01)
- *H01L 29/40* (2006.01)

(52) U.S. Cl.
CPC ........ *H01L21/265* (2013.01); *H01L 21/26513* (2013.01); *H01L 21/30604* (2013.01); *H01L 21/31116* (2013.01); *H01L 21/76213* (2013.01); *H01L 29/1095* (2013.01); *H01L 29/408* (2013.01)

(56) References Cited

U.S. PATENT DOCUMENTS 6,790,746 B1  9/2004  Yang
8,871,594 B2 * 10/2014 Mariani ............ H01L 29/66681
                                                                257/335

* cited by examiner

MANUFACTURING METHOD FOR SEMICONDUCTOR DEVICE WITH DISCRETE FIELD OXIDE STRUCTURE

FIELD OF THE INVENTION

The present invention relates to a manufacturing method for a semiconductor device, and more particularly relates to a manufacturing method for semiconductor device with a discrete field oxide structure.

BACKGROUND OF THE INVENTION

In modern integrated circuit design, a high voltage LDMOS (Laterally Diffused Metal Oxide Semiconductor) device is widely used. A voltage endurance of the LDMOS FET is achieved through a drift region of the drain of the MOS FET and a principle of reduced surface field (RESURF). The drift region is formed by performing an ion implantation process and a high temperature thermal diffusion process. The drift region usually includes a thermal oxide layer with a certain thickness, a polysilicon is laminated on the thermal oxide layer, an upper surface potential distribution on the drift region is changed to realize a full depletion of the drift region, an extreme voltage endurance under a limited drift region length is achieved.

Generally, a high voltage process for a line width greater than 0.35 μm employs a local oxidation of silicon (LOCOS) method to isolate, a stacked field oxide used by the oxide layer on the drift region is a LOCOS method. A field oxide region is defined by photolithography, and a field oxide of a first step is grown. A photolithography process is performed to define a drift region, a thermal oxidation layer is performed to grow an oxide layer of the drift region, meanwhile a second step of growth is achieved through overlapping growth on the field oxide region. Thicknesses of the drift region thermal oxidation layer and the field oxide can be fitted in any combination, a better depletion of the drift region can be achieved, a length of the bird beak of the field oxide cannot be controlled, an area of the source region can be affected, which will lead to an electric leakage when in a serious situation, causing a yield thereof to be low.

SUMMARY OF THE INVENTION

Accordingly, in order to address the problem of a too long bird beak in a conventional stacked field oxide method, it is necessary to provide a manufacturing method for a semiconductor device with a discrete field oxide structure which can optimize a length of the bird beak of the field oxide.

A manufacturing method for a semiconductor device having a discrete field oxide structure includes: growing a first PAD oxide layer on a surface of a wafer; forming a first silicon nitride layer on the first PAD oxide layer through deposition; defining a field region by photolithography and etching the field region to remove the first silicon nitride layer located on the field region; performing an ion implantation process to the field region; performing an oxidation process to the field region to grow a field oxide layer; peeling off the first silicon nitride layer; wet-dipping the wafer to remove the first PAD oxide layer and a part of the field oxide layer to reduce a length of a bird beak of the field oxide layer; growing a second PAD oxide layer on the surface of the wafer, forming a second silicon nitride layer on the second PAD oxide layer through deposition, the second silicon nitride layer fully covering the field oxide layer; defining a drift region by photolithography and etching the drift region to remove the second silicon nitride layer located on the drift region; performing an ion implantation process to the drift region; and performing an oxidation process to the drift region to grow a drift region oxide layer.

According to one embodiment, a step of defining a field region by photolithography and etching the field region comprises: coating photoresist and defining the field region through exposure and development, etching the first silicon nitride layer on the field region by performing a plasma etching process, removing the photoresist and cleaning the wafer, a step of removing the photoresist and cleaning the wafer is executed before a step of performing an oxidation process to the field region.

According to one embodiment, a step of defining a drift region by photolithography and etching the drift region comprises: coating photoresist and defining the drift region through exposure and development, removing the second silicon nitride layer on the drift region by performing a plasma etching process, removing the photoresist and cleaning the wafer, a step of removing the photoresist and cleaning the wafer is executed before a step of performing an oxidation process to the drift region.

According to one embodiment, wherein a step of forming a first silicon nitride layer and a second silicon nitride layer through deposition is performed through a low pressure furnace.

According to one embodiment, after a step of performing an oxidation process to the drift region to grow a drift region oxide layer, the method further comprises peeling off the second silicon nitride layer.

According to one embodiment, in a step of peeling off the first silicon nitride layer, the first silicon nitride layer is peeled off through a phosphoric acid solution.

According to one embodiment, thicknesses of the first PAD oxide layer and the second PAD oxide layer are both 150 angstroms.

According to one embodiment, in a step of wet-dipping the wafer to remove the first PAD oxide layer and a part of the field oxide layer, a thickness of a removed field oxide layer is 200 angstroms.

According to one embodiment, in a step of performing an oxidation process to the field region to grow a field oxide layer, a thickness of a grown field oxide layer is 6000 angstroms.

According to one embodiment, in a step of performing an oxidation process to the drift region to grow a drift region oxide layer, a thickness of a grown drift region oxide layer is 3000 angstroms.

According to one embodiment, the semiconductor device is a LDMOS FET.

The above-mentioned method peels off the silicon nitride layer after the growth of the field oxide layer is completed, at this time, the length of a bird beak of field-oxide layer can be optimized by adjusting a wet-dipping amount to solve the problem that the bird beak of field-oxide layer is too long.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

The details of one or more embodiments of the invention are set forth in the accompanying drawings and the description below. Other features, objects, and advantages of the invention will be apparent.

Figure 1:
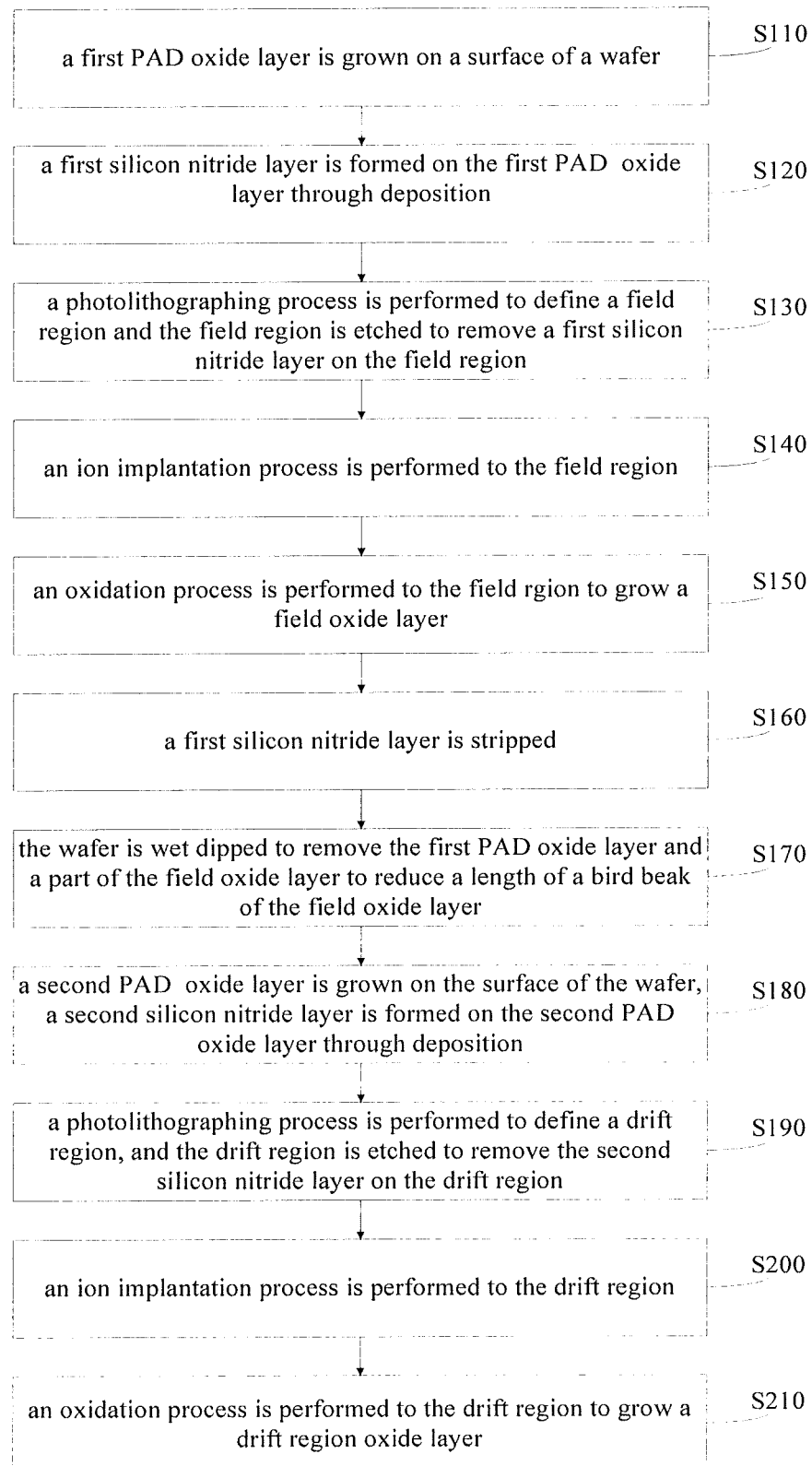
FIG. 1 is a flowchart of a manufacturing method for a semiconductor device with a discrete field oxide structure.

FIG. 1 is a flow chart of a manufacturing method for semiconductor device with a discrete field oxide, the method includes the following steps.

S110, a first PAD oxide layer is grown on a surface of a wafer.

A first PAD oxide layer is grown on a surface of a silicon substrate by performing a thermal oxidation process. The first PAD oxide layer can reduce stress between silicon and a subsequently deposited silicon nitride layer. The thicker the first PAD oxide layer, the smaller the stress between silicon and silicon nitride will be, but affection to a shape and a size of a source region would be great. In the illustrated embodiment, a thickness of the first PAD oxide layer is 150 angstroms, in other embodiments, the person skilled in the art can make a selection according to an actual situation of the device.

S120, a first silicon nitride layer 302 is formed on the first PAD oxide layer through deposition.

Figure 2A:
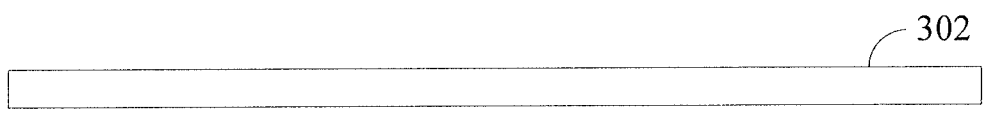
FIG. 2A to FIG. 2F are schematic cross-sectional views of semiconductor devices in manufacturing process of a manufacturing method for semiconductor device with discrete field oxide structure.

FIG. 2A is a cross-sectional view of a device after step S120 is finished. It should be noted that, silicon substrates below the first silicon nitride layer 302 in all figures are not shown, the first PAD oxide layer is also not shown, because it is relatively thin. The person skilled in the art can clearly understand the structure of the device according to the description of the specification and claims.

In the illustrated embodiment, depositing to form a first silicon nitride layer 302 is performed by a low pressure furnace. In other embodiments, the person skilled in the art can deposit a first silicon nitride layer 302 by performing other known processes of depositing silicon nitride.

S130, a field region is defined by photolithography, and the field region is etched to remove the first silicon nitride layer located on the field region.

A photoresist is coated, the field region is defined through exposure and development, then a plasma etching process is performed to remove the first silicon nitride layer on the field region. In other embodiments, the first silicon nitride layer can be removed by performing a dry etching process and a wet etching process which is public known and suitable for etching silicon nitride.

S140, an ion implantation process is performed to the field region.

Figure 2B:
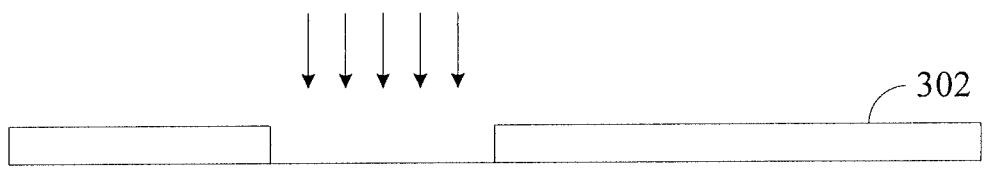

After the photolithography process is finished, the photoresist is removed and the field region is cleaned. The cleaning process can be performed before performing an ion implantation process, or it can be performed after the ion implantation process and before step S150. FIG. 2B is a schematic view of performing an ion implantation process to the field region according to the embodiment shown in FIG. 2A.

S150, an oxidation process is performed to the field region to grow a field oxide layer 304.

Figure 2C:
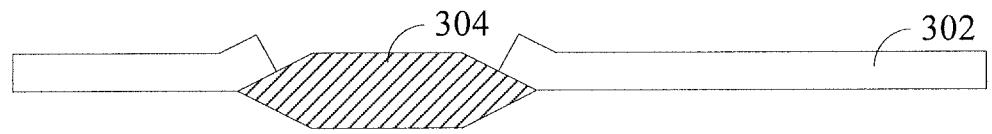

FIG. 2C is a cross sectional view of the device after step S150 is finished in the embodiment shown in FIG. 2A. The field oxide layer 304 can be grown by performing a thermal oxidation process.

S160, the first silicon nitride layer 302 is peeled off.

Figure 2D:
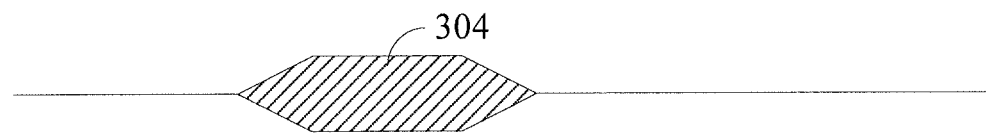

In the illustrated embodiment, a phosphoric acid solution is used to remove the first silicon nitride layer 302. In other embodiments, the first silicon nitride layer 302 can be peeled off through other well known peeling off methods in the field. FIG. 2D is a cross-sectional view of a device after step S160 according to the embodiment shown in FIG. 2A.

S170, the wafer is wet dipped to remove the first PAD oxide layer and a part of the field oxide layer 304 to reduce a length of a bird beak of the field oxide layer 304.

As the first silicon nitride layer 302 is peeled off, a wet dipping amount can be adjusted to achieve a control to the bird beak of the field oxide. In the illustrated embodiment, the peeled off oxide layer 304 has a thickness of 200 angstroms.

S180, a second PAD oxide layer is grown on the surface of the wafer, a second silicon nitride layer 312 is formed on the second PAD oxide layer through deposition.

A PAD oxide layer can be grown through performing a thermal oxidation process, the second silicon nitride layer 312 can be deposited through a low pressure furnace. The second silicon nitride layer 312 fully covers the field oxide layer 304.

S190, a drift region is defined by photolithography, and the drift region is etched to remove the second silicon nitride layer located on the drift region.

A photoresist is coated, and a drift region is defined through exposure and development, then the second silicon nitride layer is removed by performing a plasma etching process.

S200, an ion implantation process is performed to the drift region.

Figure 2E:
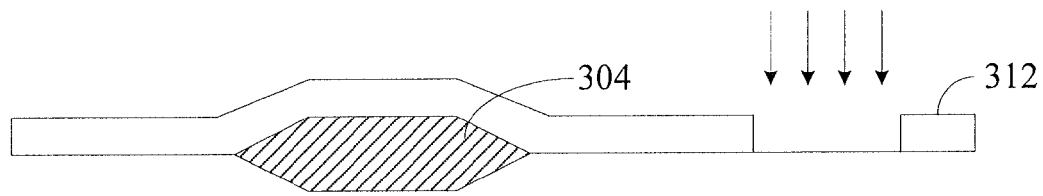

After a photolithography process is performed to the drift region, the photoresist is removed and the drift region is cleaned. The cleaning process can be performed before an ion implantation process is performed to the drift region, or the drift region can be cleaned after an ion implantation process is performed to the drift region and before step S210. FIG. 2E is a schematic view of performing an ion implantation process to the drift region according to the embodiment shown in FIG. 2A.

S210, an oxidation process is performed to the drift region to grow a drift region oxide layer 314.

Figure 2F:
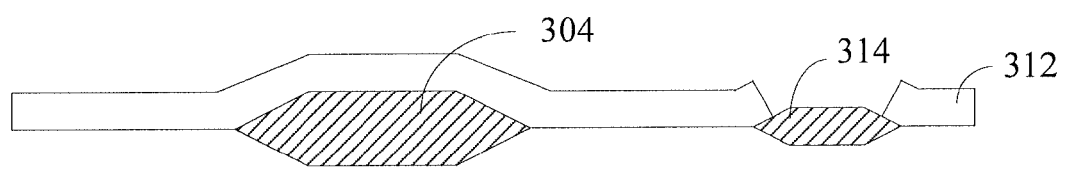

FIG. 2F is a schematic view of the device after step S210 according to the embodiment shown in FIG. 2A. The drift region oxide layer 314 can be grown by performing a thermal oxidation process. As the silicon nitride layer 312 fully covers the field oxide layer 304, the field oxide layer 304 is protected by the silicon nitride layer 312, a step of performing a thermal oxidation process to grow in step S210 will not increase a thickness of the field oxide layer 304.

After step S210 is finished, a phosphoric acid solution is used to peel off the second silicon nitride layer.

In the manufacturing method for semiconductor device with the discrete field oxide structure, after the first field oxide layer 304 is grown, the first silicon nitride layer 302 is peeled off, a wet dipping amount can be adjusted to optimize the length of the bird beak of the field oxide, which can resolve a problem of too long bird beak of the field oxide layer. After wet dipping, the second PAD oxide layer and the second silicon nitride layer 312 are re-grown. In a follow up step of growing the drift region oxide layer 314, a thickness of the drift region oxide layer 314 can be adjusted freely, which will not affect a thickness of the field oxide layer 304.

In an embodiment, a thickness of the field oxide layer 304 is designed to be 5800 angstroms, a thickness of the drift region oxide layer 314 is 3000 angstroms. A field oxide layer 304 with a thickness of 6000 angstroms is grown in step S150, a field oxide layer 304 with a thickness of 200 angstroms is removed by wet dipping, a drift region oxide layer 314 with a thickness of 3000 angstroms is grown in step S210.

The manufacturing method for semiconductor device with discrete field oxide structure can be applied to manufacture a LDMOS device, or the above method can also be used to manufacture semiconductor devices separated by LOCOS process.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A manufacturing method for a semiconductor device having a discrete field oxide structure, comprising:
   growing a first PAD oxide layer on a surface of a wafer;
   forming a first silicon nitride layer on the first PAD oxide layer through deposition;
   defining a field region by photolithography and etching the field region to remove the first silicon nitride layer located on the field region;
   performing an ion implantation process to the field region;
   performing an oxidation process to the field region to grow a field oxide layer;
   peeling off the first silicon nitride layer;
   wet-dipping the wafer to remove the first PAD oxide layer and a part of the field oxide layer to reduce a length of a bird beak of the field oxide layer;
   growing a second PAD oxide layer on the surface of the wafer, forming a second silicon nitride layer on the second PAD oxide layer through deposition, the second silicon nitride layer fully covering the field oxide layer;
   defining a drift region by photolithography and etching the drift region to remove the second silicon nitride layer located on the drift region;
   performing an ion implantation process to the drift region; and
   performing an oxidation process to the drift region to grow a drift region oxide layer.

2. The method according to claim 1, wherein the step of defining a field region by photolithography and etching the field region comprises: coating photoresist and defining the field region through exposure and development, removing the first silicon nitride layer on the field region by performing a plasma etching process, removing the photoresist and cleaning the wafer, the step of removing the photoresist and cleaning the wafer is executed prior to the step of performing an oxidation process to the field region.

3. The method according to claim 1, wherein the step of defining a drift region by photolithography and etching the drift region comprises: coating photoresist and defining the drift region through exposure and development, removing the second silicon nitride layer on the drift region by performing a plasma etching process, removing the photoresist and cleaning the wafer, the step of removing the photoresist and cleaning the wafer is executed prior to the step of performing an oxidation process to the drift region.

4. The method according to claim 1, wherein the step of forming a first silicon nitride layer and a second silicon nitride layer through deposition is performed through a low pressure furnace.

5. The method according to claim 1, wherein after the step of performing an oxidation process to the drift region to grow a drift region oxide layer, the method further comprises peeling off the second silicon nitride layer.

6. The method according to claim 1, wherein in the step of peeling off the first silicon nitride layer, the first silicon nitride layer is peeled off through a phosphoric acid solution.

7. The method according to claim 1, wherein thicknesses of the first PAD oxide layer and the second PAD oxide layer are both 150 angstroms.

8. The method according to claim 7, wherein in the step of wet-dipping the wafer to remove the first PAD oxide layer and a part of the field oxide layer, a thickness of the removed field oxide layer is 200 angstroms.

9. The method according to claim 8, wherein in the step of performing an oxidation process to the field region to grow a field oxide layer, a thickness of the grown field oxide layer is 6000 angstroms.

10. The method according to claim 8, wherein in the step of performing an oxidation process to the drift region to grow a drift region oxide layer, a thickness of the grown drift region oxide layer is 3000 angstroms.

11. The method according to claim 1, wherein the semiconductor device is a laterally diffused metal oxide semiconductor FET.

* * * * *